(12) United States Patent
Matsubara et al.

(10) Patent No.: US 10,211,022 B2
(45) Date of Patent: Feb. 19, 2019

(54) ION BEAM APPARATUS AND ION BEAM IRRADIATION METHOD

(71) Applicant: Hitachi High-Technologies Corporation, Tokyo (JP)

(72) Inventors: Shinichi Matsubara, Tokyo (JP); Hiroyasu Shichi, Tokyo (JP); Yoshimi Kawanami, Tokyo (JP); Tomihiro Hashizume, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 63 days.

(21) Appl. No.: 15/501,584

(22) PCT Filed: Jul. 31, 2015

(86) PCT No.: PCT/JP2015/071734
§ 371 (c)(1),
(2) Date: Feb. 3, 2017

(87) PCT Pub. No.: WO2016/021484
PCT Pub. Date: Feb. 11, 2016

(65) Prior Publication Data
US 2017/0229277 A1 Aug. 10, 2017

(30) Foreign Application Priority Data
Aug. 6, 2014 (JP) ................. 2014-160001

(51) Int. Cl.
*H01J 37/08* (2006.01)
*H01J 37/18* (2006.01)
*H01J 37/28* (2006.01)

(52) U.S. Cl.
CPC .............. *H01J 37/08* (2013.01); *H01J 37/18* (2013.01); *H01J 37/28* (2013.01); *H01J 2237/002* (2013.01)

(58) Field of Classification Search
CPC .. H01J 37/08; H01J 37/28; H01J 37/18; H01J 2237/002
(Continued)

(56) References Cited

U.S. PATENT DOCUMENTS

| 2009/0121148 A1* | 5/2009 | Pohl ..................... H01J 27/26 250/396 R |
| 2012/0018648 A1* | 1/2012 | Gierak .................. H01J 27/26 250/396 R |
| 2013/0264496 A1 | 10/2013 | Arai | |

FOREIGN PATENT DOCUMENTS

| JP | 60-133635 A | 7/1985 |
| WO | 2012/086419 A1 | 6/2012 |

OTHER PUBLICATIONS

International Search Report of PCT/JP2015/071734 dated Sep. 29, 2015.

* cited by examiner

*Primary Examiner* — Nicole Ippolito
(74) *Attorney, Agent, or Firm* — Mattingly & Malur, PC (57) ABSTRACT

A gas field ionization source in which an ion beam current is stable for a long time is achieved in an ion beam apparatus equipped with a field ionization source that supplies gas to a chamber, ionizes the gas, and applies the ion beam to a sample. The ion beam apparatus includes an emitter electrode having a needle-like extremity; a chamber inside which the emitter electrode is installed; a gas supply unit that supplies the gas to the chamber; a cooling unit that is connected to the chamber and cools the emitter electrode; a discharge type exhaust unit that exhausts gas inside the chamber; and a trap type exhaust unit that exhausts gas inside the chamber. The exhaust conductance of the discharge type exhaust unit is larger than the total exhaust conductance of the trap type exhaust unit.

15 Claims, 3 Drawing Sheets

(58) Field of Classification Search
USPC .......... 250/423 R, 424, 423 F, 492.1, 492.2,
250/492.21, 492.22, 492.23, 492.3
See application file for complete search history.

ION BEAM APPARATUS AND ION BEAM IRRADIATION METHOD

TECHNICAL FIELD

The present invention relates to an ion beam apparatus and an ion beam irradiation method.

BACKGROUND ART

An external structure of a sample can be observed by focusing a beam of electrons through an electromagnetic field lens, scanning and irradiating a sample with the focused beam of electrons, and detecting secondary electron charged particles emitted from the sample. This is called a scanning electron microscope. On the other hand, an external structure of a sample can also be observed by focusing a beam of ions through an electromagnetic field lens, scanning and irradiating a sample with the beam of ions, and detecting secondary charged particles emitted from the sample. This is called a Scanning Ion Microscope (hereinafter abbreviated to SIM).

As an ion source for use in a SIM, it is preferable to use a Gas Field Ionization Source (hereinafter abbreviated to GFIS).

In a SIM using the GFIS, in order to obtain a sample image with reduced noise, it is necessary to obtain an ion beam having a large current density on a sample. To do so, it is necessary to increase an ion emission angle current density of the field ionization source. To increase the ion emission angle current density, it will be expedient to increase the density of ionized gas near an emitter tip.

Then, by cooling the temperature of the emitter tip to a low temperature, molecules of ionized gas hitting against the emitter tip become massed together, as their energy decreases, and, therefore, the density of the molecules of ionized gas can be increased. As means for cooling the emitter tip, a mechanical refrigerator is preferable.

As a matter of course, the density of ionized gas near the emitter tip can be increased by increasing the pressure of ionized gas introduced into a space around the emitter tip. However, the gas introduction at 1 Pa or more causes a problem in which the ion beam neutralizes by colliding with the ionized gas and the ion beam current decreases or a glow discharge occurs. To solve this problem, it is known that the ion emission angle current density is increased by narrowing a gas ionization region by forming a projection tip with several atoms at the extremity of the emitter tip and by efficient ionization of ionized gas that is supplied in a limited quantity.

Patent Literature 1 discloses an example of a charged particle emission gun in which cleaning a tip can be performed without deactivating the charged particle emission gun for a long time and without heating the tip.

CITATION LIST

Patent Literature

Patent Literature 1: WO2012/086419

SUMMARY OF INVENTION

Technical Problem

Application of a GFIS for ionizing a hydrogen gas that is smaller in mass than a helium gas and suitable for observation use to a charged particle microscope poses problems discussed below. For a gas field ionization source, it is necessary to introduce ionized gas into a space near an emitter tip, as noted previously. If an impurity gas is mixed in this ionized gas, it is possible that impurity gas molecules adsorb to and desorb from the emitter tip in the vicinity of its extremity. Or if the degree of vacuum of a space in which the tip is located is low, it is possible that an impurity gas existing intrinsically in the space adsorbs to and desorbs from the emitter tip in the vicinity of its extremity.

Such adsorption and desorption of molecules cause deformation of the shape of the extremity of the emitter tip and change of an electric field in the vicinity of the extremity. The change of the electric field gives rise to change in the ion beam current. As another problem, there is an influence also in a case where an impurity adsorbs to and desorbs from a portion of the emitter tip other than its extremity. A portion to which an impurity gas has adsorbed bulges as much as the thickness of an impurity gas deposition layer and, therefore, its electric field is higher than other portions and it is possible that ion beam emission occurs from that portion. If ion beam emission occurs from the portion to which an impurity gas has adsorbed, a quantity of ionized gas corresponding to the amount of the ion beam emission is consumed at that portion. In consequence, there is a decrease in the amount of ionized gas supplied to the atoms and primarily used as the ion source. This gives rise to change in the ion beam current.

In a case where helium is used as gas that is introduced for the GFIS, because of high ionization energy of helium, the electric field at the extremity of an emitter tip should be relatively high. If the electric field at the extremity of the tip is high, an impurity gas is ionized before approaching near the extremity and becomes unable to adsorb to the tip.

However, in a case where hydrogen having smaller ionization energy than helium is used as gas that is introduced for the GFIS, the above-noted influence of an impurity gas becomes significant. The electric field at the emitter tip for ionizing the gas is small and impurity gas molecules easily approach the tip surface and their adsorption and desorption occur; therefore, there is much difficulty for stable operation.

A so-called trap type vacuum exhaust unit is effective to reduce an impurity gas from around the emitter tip. As a trap type vacuum exhaust unit, a cryopump, a titanium sublimation pump, a non-evaporable getter pump, etc. are available. The above vacuum exhaust unit is capable of exhausting an impurity gas and can reduce the amount of an impurity gas around the emitter tip.

However, since the above vacuum exhaust unit has a large exhaust capacity for hydrogen as well and its exhaust speed is not always constant, its use poses a problem in which hydrogen pressure around the emitter varies with variation in the exhaust speed and, consequently, the amount of current of a hydrogen ion beam varies. Hence, when a gas field ionization source is active, that is, when hydrogen gas is introduced into a space around the emitter tip, vacuum exhaust of the space around the emitter chip using the above means has not be considered heretofore. This is because, in the case of a helium gas used heretofore, the trap type vacuum exhaust unit has a low influence on the helium gas in terms of effecting adsorption action. But, in the case of a hydrogen gas or nitrogen gas, the above unit has an influence on both an ion species gas and an impurity gas in terms of effecting adsorption action and the influence on an ion species gas is not negligible.

In a structure of Patent Literature 1, in order to remove desorbed molecules arising from remaining gas molecules that inevitably exist in a vacuum atmosphere in a vacuum case, a structure in which a chip peripheral member that is an electron source at an extremely low temperature is made to trap the desorbed molecules in the same action as a cryopump for removal of the desorbed molecules is disclosed. However, there is no disclosure of means that controls a vacuum exhaust unit exhausting gas to exhaust a quantity of gas and selectively exhaust a particular gas only.

Solution to Problem

The present invention solves problems noted above by configuring a gas field ionization source for gas typified by hydrogen and nitrogen as described below.

By way of one example, the present invention resides in an ion beam apparatus equipped with a field ionization source that supplies gas to a chamber, ionizes the gas, and applies an ion beam to a sample and including: an emitter electrode having a needle-like extremity; a chamber inside which the emitter electrode is installed; a gas supply unit that supplies the gas to the chamber; a cooling unit that is connected to the chamber and cools the emitter electrode; a discharge type exhaust unit that exhausts gas inside the chamber; and a trap type exhaust unit that exhausts gas inside the chamber. The ion beam apparatus is characterized in that exhaust conductance of the discharge type exhaust unit is larger than total exhaust conductance of the trap type exhaust unit.

By way of another example, the present invention resides in an ion beam irradiation method having an irradiation step of applying an ion beam generated by ionizing introduced gas to a sample, the ion beam irradiation method including: a cooling step of cooling an emitter electrode having a needle-like extremity by a cooling unit; a supply step of supplying the gas to a space near the emitter electrode; a discharge type exhaust step of exhausting gas inside the chamber using a discharge type exhaust unit; a trap type exhaust step of exhausting gas inside the chamber using a trap type exhaust unit that differs from the discharge type exhaust unit; a measurement step of measuring pressure near the emitter electrode using a pressure sensor; and a gas flow rate control step of controlling the amount of the gas to be supplied at the supply step and the amount of the gas to be exhausted at the discharge type exhaust step, based on a result of measurement made by the measurement step. The ion beam irradiation method is characterized in that the gas flow rate control step is performed to keep exhaust conductance of the discharge type exhaust unit larger than exhaust conductance of the trap type exhaust unit.

By way of yet another example, the present invention resides in an ion beam apparatus equipped with a field ionization source that supplies gas to a chamber, ionizes the gas, and applies an ion beam to a sample and characterized by including: an emitter electrode having a needle-like extremity; a chamber inside which the emitter electrode is installed; a gas supply unit that supplies the gas to the chamber; a cooling unit that is connected to the chamber and cools the emitter electrode; a cryogenic member that is connected to the chamber from the cooling unit via a heat transfer section and adsorbs at least two or more gas species, i.e., a gas species from which the ion beam is generated and a gas species other than the gas species from which the ion beam is generated; a heater connected to the cryogenic member; and a temperature control unit that controls temperature of the heater.

Advantageous Effects of Invention

According to the present invention, the amount of an impurity gas around the emitter tip is reduced and the stability of an ion beam is enhanced. In addition, the pressure of an ion species gas around the emitter tip becomes stable and the stability of an ion beam is enhanced.

DESCRIPTION OF EMBODIMENTS

An embodiment that is common for the present invention is first described. However, it will be appreciated that a structure of the invention of the present application other than that described in the following is applicable without departing from the concept of the present invention.

First, a GFIS (field ionization source) is outlined below. A high voltage is applied to an emitter tip made of metal and with its extremity having a curvature radius of about 100 nm or less and an electric field is centralized on the extremity. When gas to be ionized is introduced into a space near the emitter tip, the electric field ionizes molecules of the gas and an ion beam is pulled out. The GFIS can generate an ion beam whose energy width is narrower in comparison with other ion sources. The GFIS also can generate a finer ion beam, because the ion generation source is smaller in size than other ion sources.

Then, ion species that are used for surface observation are described. Ion species whose mass is light, such as hydrogen and helium, are preferable. This is because, for ion species whose mass is light, the intensity of their action of sputtering the surface of a sample is small and damage to the surface of a sample can be minimized. A beam of these ions has a feature in which it is more sensitive to information of the surface of a sample than an electron beam. This is because, when a hydrogen or helium ion enters the surface of a sample, a region of exciting secondary charged particles is more localized to the surface of a sample, as compared with an electron beam irradiation.

In addition, because the nature of an electron beam as electronic waves is not negligible, aberration takes place due to a diffraction effect. On the other hand, for an ion beam, the diffraction effect can be ignored, because ions are heavier than electrons.

Conversely, irradiating a sample with one of ion species whose mass is heavy, typified by oxygen, nitrogen, argon, krypton, xenon, etc. is preferable for processing a sample by sputtering action. Among others, a focused ion beam apparatus using a liquid metal ion is known as an ion beam processing apparatus.

In the following, a first embodiment of a gas field ionization source will be described concretely with reference to FIG. 1. By the way, a cryogenic pump that is described herein is a member that produces a cryogenic effect and does not necessarily have to be equipped with a cooling mechanism. This is because transfer of cold air from a cooling mechanism or the like that cools gas to be introduced into a space in the ionization source produces a cryogenic effect.

The gas field ionization source 1 includes an emitter electrode 11 having a needle-like extremity, a pull-out electrode 13 having an opening in a position facing the emitter electrode 11, a refrigerator 4 that cools the emitter electrode 11, a vacuum chamber 17 that encloses the emitter electrode 11, the pull-out electrode 13, and a refrigerator 1st stage and a refrigerator 2nd stage comprised in a refrigerator main unit 41 of the cooling mechanism 4, a trap type vacuum exhaust unit 18 connected to the vacuum chamber 17, a discharge type vacuum exhaust unit 16 connected to the vacuum chamber 17, a gas supply unit 37 that supplies gas, e.g., a hydrogen gas to an internal space of the vacuum chamber 17, and a power supply 111 that applies a voltage between the emitter electrode 11 and the pull-out electrode 13 to form an electric field for ionizing the gas near the extremity of the emitter electrode 11.

The internal space of the vacuum chamber 17 of the gas field ionization source is maintained at ultra-high vacuum of $10^{-7}$ Pa or less, when a hydrogen gas is not introduced into the space by the gas introduction mechanism 37. To reach the ultra-high vacuum state inside the vacuum chamber 17, heating the whole vacuum chamber 17 to 100 degrees or more, i.e., so-called baking may be included in a start-up operation of the gas field ionization source 1.

To emit a hydrogen ion beam from the emitter tip 11 of the gas field ionization source 1, first, a high voltage is applied between the emitter electrode 11 and the pull-out electrode 13 using the power supply 111. The extremity of the emitter tip 11 is sharpened and an electric field is concentrated on the extremity by the high voltage application. In this state, by introducing the hydrogen gas into the space inside the vacuum chamber 17 using the gas supply unit 37, a hydrogen ion beam is emitted from the extremity of the emitter tip 11.

To increase the luminance of the hydrogen ion beam, it is necessary to optimize the temperature for cooling the emitter tip 11 by the cooling mechanism 4. It is also needed to optimize the pressure of the hydrogen gas that is introduced into the space inside the vacuum chamber 17. In addition, it is need to terminate the extremity of the emitter tip 11 to an atomic level such as, e.g., one atom, three atoms, or seven atoms.

To sharpen the extremity of the emitter tip 11 to an atomic level, a method including heating the emitter tip 11 may be used. Likewise, to sharpen the extremity of the emitter tip 11, a method that introduces gas such as, e.g., $O_2$ or $N_2$ into the space inside the vacuum chamber 17 while heating the emitter tip 11 may be used. Likewise, to sharpen the extremity of the emitter tip 11, a method that introduces gas such as, e.g., $O_2$ or $N_2$ into the space inside the vacuum chamber 17 while applying a high voltage between the emitter electrode 11 and the pull-out electrode 13 may be used. Likewise, the emitter tip 11 may be made with a needle whose primary component is tungsten and, after evaporating a precious metal such as, e.g., Ir, Pt, or Pd on the surface of the tip, a method of heating the emitter tip 11 may be used.

The trap type vacuum exhaust unit 18 is, for example, a getter pump typified by a titanium sublimation pump or a non-evaporable getter pump. A cryogenic pump 414 may be provided instead of the above trap type vacuum exhaust unit 18 or additionally. Such a trap type vacuum exhaust unit produces an effect of reducing the amount of an impurity gas such as, e.g., CO, $CO_2$, or $CH_4$ inside the vacuum chamber. Such impurity gas becomes a cause of destabilizing an ion beam 15 emitted from the emitter tip 11 of the gas field ionization source 1, as discussed previously. The cryogenic pump 414 may be provided in any part of a member that is cooled by the cooling mechanism 4 in the gas field ionization source 1. Providing the cryogenic pump, particularly, in a part whose cooling temperature is as low as possible enables cooling at most efficiently; this, therefore, makes control easy and is effective for reducing impurity gas.

Figure 1:
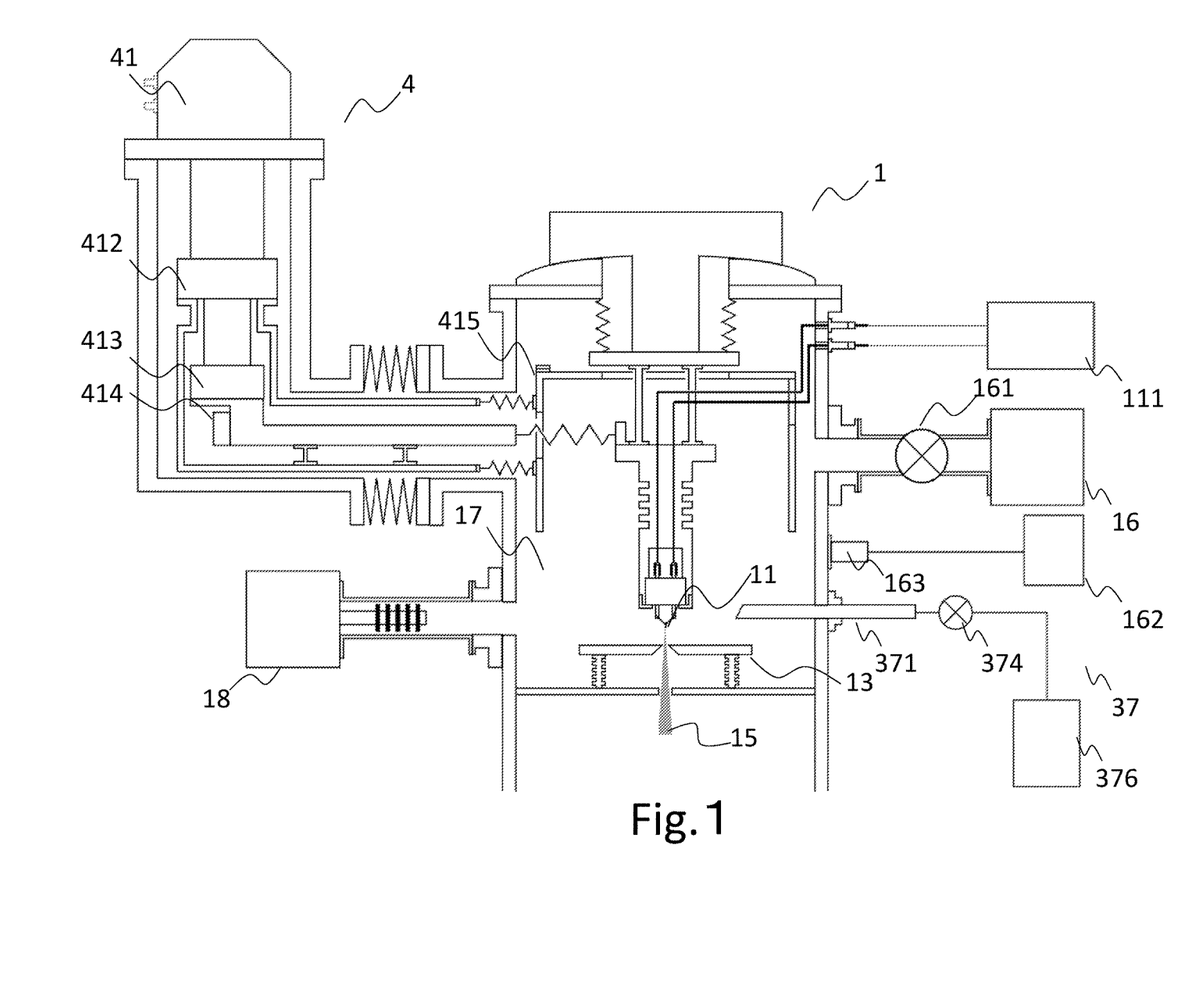
FIG. 1 is an overall schematic structural diagram of a gas field ionization source.

Taking this respect into consideration, in an example of FIG. 1, an example is presented where the cryogenic pump 414 is disposed near the refrigerator 2nd stage 413.

It is efficient to carry out an operation of initialization of the trap type vacuum exhaust unit 18 or the cryogenic pump 414 involving heating, while the vacuum chamber 17 is maintained at a high temperature by the above baking operation. The cryogenic pump 414 with a larger surface area is more capable of reducing the above impurity gas. Hence, the cryogenic pump 414 may employ a fin structure having several metallic plates of good heat conductivity, such as, e.g., cupper or aluminum, or a material with innumerable microscopic perforations, such as an activated carbon, among others.

The trap type vacuum exhaust unit 18 or the cryogenic pump 414 produces an effect of reducing the remaining gas inside the vacuum chamber; at the same time, it also exhausts hydrogen gas that is introduced by the gas introduction mechanism 37 at an exhaust speed and the exhaust capacity of a pump that is disposed there is not constant. For example, the exhaust speed of a non-evaporable getter pump decreases according to the quantity of the hydrogen gas discharged from the vacuum chamber. For another example, the exhaust speed of the cryogenic pump largely changes depending on the temperature of cryogenic pump.

This largely differs from a case where a helium gas is selected as gas from which an ion beam is generated. Both the non-evaporable getter pump and the cryogenic pump exhaust helium gas at a low speed and it may be said that they only exhaust gas other than the helium gas, namely, impurity gas. Because the speed at which these pumps exhaust helium gas is intrinsically low, there is only a small change in the exhaust speed due to saturation and this change has only a slight influence on the gas pressure in the vicinity of the tip. The dependence of the exhaust speed of the cryogenic pump on its temperature is very small for helium.

For this reason, if helium gas was selected as an ion species in a traditional ion microscope, it was preferred to make the flow rate of a helium gas that is introduced by the cryogenic pump as small as possible. This is because doing so was considered to be preferable in terms of saving the amount of gas consumption and in terms of reducing the amount of an impurity gas entering from the gas supply section to around the tip. Therefore, the present invention is to solve a problem that could not occur in a traditional helium gas ion microscope.

Now, if a hydrogen gas was selected as gas from which an ion beam is generated, the change in the exhaust speed of the cryogenic pump can be avoided by adjusting the temperature of the cryogenic pump.

It is preferable to control the temperature of the cryogenic pump to fall within a range from 10 K to 30 K in order to reduce an impurity other than hydrogen. The cryogenic pump whose temperature falls within this temperature range also exhausts the hydrogen gas at an exhaust speed, but the pressure of the hydrogen gas introduced into the space inside the vacuum chamber 17 can be stabilized by controlling the flow rate and pressure of the hydrogen gas.

Meanwhile, it is preferable to control the temperature of the emitter tip 11 to fall in a range from 20 K to 60 K in order to stabilize the ion beam 15 and increase the amount of the beam current. At a lower temperature within this temperature range, the amount of current of the ion beam 15 becomes higher, but the quantity of an impurity gas that adsorbs to the extremity of the emitter tip 11 also increases.

Taking this effect into account, a user can set the temperature optionally within the above range.

As per the foregoing description, in comparison with a case where a traditional cryogenic pump is simply installed, it is possible to realize an exhaust unit that produces a cryogenic effect without installing an additional cooling mechanism. This is due to the fact that the inventors examined conditions specific to a gas species other than a helium gas in an ion beam apparatus such as a field ionization source.

By including a control unit for performing temperature control of the cryogenic effect in order to adsorb a particular gas to be exhausted beyond performance equivalent to that of a traditional cryogenic pump, it is possible to provide more preferable exhaust performance. This is also due to the fact that the inventors examined specific conditions in an ion beam apparatus such as a field ionization source using a hydrogen gas among others.

Then, descriptions are provided about an arrangement expected to provide a greater effect by its implementation in conjunction with performing control of the cryogenic effect described above.

Through further consideration of the present invention by the inventors, it was found that, when a hydrogen gas necessary for emission of the ion beam 15 was introduced, the temperature of a cooled section inside the vacuum chamber 17 largely changed. This is due to an effect of heat exchange taking place between the outer wall of the vacuum chamber 17 and the cooled section via the introduced hydrogen gas. In addition, if a GM refrigerator is used as the refrigerator main unit 41 of the cooling mechanism 4, the temperature of the refrigerator 2nd stage 413 changes at the period of piston movement of the refrigerator and, along with this change, the temperature of the cryogenic pump 414 also changes.

Change in the speed of exhausting the hydrogen gas by the foregoing trap type exhaust unit results in change in the pressure of the hydrogen gas inside the vacuum chamber 17. Because the amount of current of the ion beam 15 emitted from the extremity of the emitter tip 11 is proportional to the hydrogen pressure inside the vacuum chamber 17, the amount of current of the ion beam 15 also changes along with the above change in the pressure of the hydrogen gas.

Therefore, in order to reduce the above change in the hydrogen gas pressure, the gas field ionization source 1 further includes an arrangement below. Exhaust conductance of the discharge type vacuum exhaust unit 16 is set to be the largest in comparison with other exhaust units. Additionally, by enabling independent control of the flow rate and pressure of the hydrogen gas supplied to the vacuum chamber 17, the change in the hydrogen gas pressure can be reduced further.

In other words, the inventors found the following: by supplying the hydrogen gas at a flow rate higher than the speed of exhausting the hydrogen gas by the foregoing trap type vacuum exhaust unit and carrying out exhaust operation using another stable vacuum exhaust unit, it was enabled to reduce the impurity gas around the emitter tip, absorb the change in the exhaust speed of the foregoing trap type vacuum exhaust unit, and stabilize the hydrogen pressure around the emitter tip. That is, while vacuum exhaust around the emitter tip is carried out by the trap type vacuum exhaust unit which is connected to the vacuum chamber, vacuum exhaust is also performed by the discharge type vacuum exhaust unit (e.g., a turbo molecular pump) whose exhaust speed is comparatively steady and which is concurrently connected to the vacuum chamber. In this use case, exhaust conductance of the discharge type vacuum exhaust unit must be larger than exhaust conductance of the trap type vacuum exhaust unit.

For instance, it will be expedient to provide a flow rate adjuster 374 upstream of a gas nozzle 371 connected to the vacuum chamber 17, which is comprised in the gas supply unit 37, and provide a flow rate adjuster 161 between the discharge type exhaust unit 16 and the vacuum chamber 17.

The discharge type vacuum exhaust unit having a steady exhaust speed should be arranged to carry out a large portion of exhaust operation, thereby enabling it to relatively reduce the change in the hydrogen gas pressure in the vacuum chamber 17, even though there is some degree of change in the exhaust speed of the trap type exhaust unit.

Furthermore, the provision of the flow rate adjuster 374 and the flow rate adjuster 161 enables it to set the hydrogen gas pressure inside the vacuum chamber 17 and the flow rate of the hydrogen gas independently. In this case, when there is a large change in the exhaust speed of the trap type exhaust unit, the flow rate of the hydrogen gas should be set at a high rate, so that change in the pressure can be reduced. But, when there is a small change in the exhaust speed of the trap type exhaust unit, the flow rate of the hydrogen gas should be decreased, so that the amount of gas consumption can be saved.

The flow rate adjuster 374 may be a so-called leak valve capable of adjusting the gas flow rate steplessly, such as, e.g., a needle valve; i.e., means that changes the conductance of any gas flow passage from a hydrogen gas container 376 to the gas nozzle 371 and supplies the hydrogen gas at a desired flow rate to the vacuum chamber 17. Alternatively, the flow rate adjuster 374 may be means that adjusts pressure in the passage from the gas nozzle 371 to the hydrogen gas container 376 and supplies he hydrogen gas at a desired flow rate to the vacuum chamber 17.

Likewise, the flow rate adjuster 374 may be a so-called leak valve capable of adjusting the gas flow rate steplessly, such as, e.g., a needle valve; i.e., means that exhaust the hydrogen at a desired flow rate by adjusting the conductance between the discharge type vacuum exhaust unit 16 and the vacuum chamber 17. Alternatively, it may be means that changes the exhaust speed of the discharge type vacuum exhaust unit 16 itself. The discharge type vacuum exhaust unit 16 having a steady exhaust speed is desirable; for example, a turbo molecular pump or the like is preferable. The vacuum exhaust speed of the turbo molecular pump can be adjusted to some extent by changing its revolving speed and its exhaust speed is steady in comparison with the trap type vacuum exhaust unit.

By the use of the flow rate adjuster 374 and the flow rate adjuster 161, it is possible to independently adjust the hydrogen gas pressure inside the vacuum chamber 17 and the amount of supply of the hydrogen gas in a range not more than the capacities of the discharge type vacuum exhaust unit 16 and the gas introduction mechanism 37. Here, the amount of supply of the hydrogen gas should be set at a flow rate equivalent to or larger than the speed at which the trap type vacuum exhaust unit 18 or cryogenic pump (a member that produces the cryogenic effect) 414 exhausts the hydrogen gas, so that it is possible to reduce the effect of change in the exhaust speed of the trap type exhaust unit 18 or cryogenic pump 414 exerted on the hydrogen gas pressure inside the vacuum chamber 17.

Figure 2:
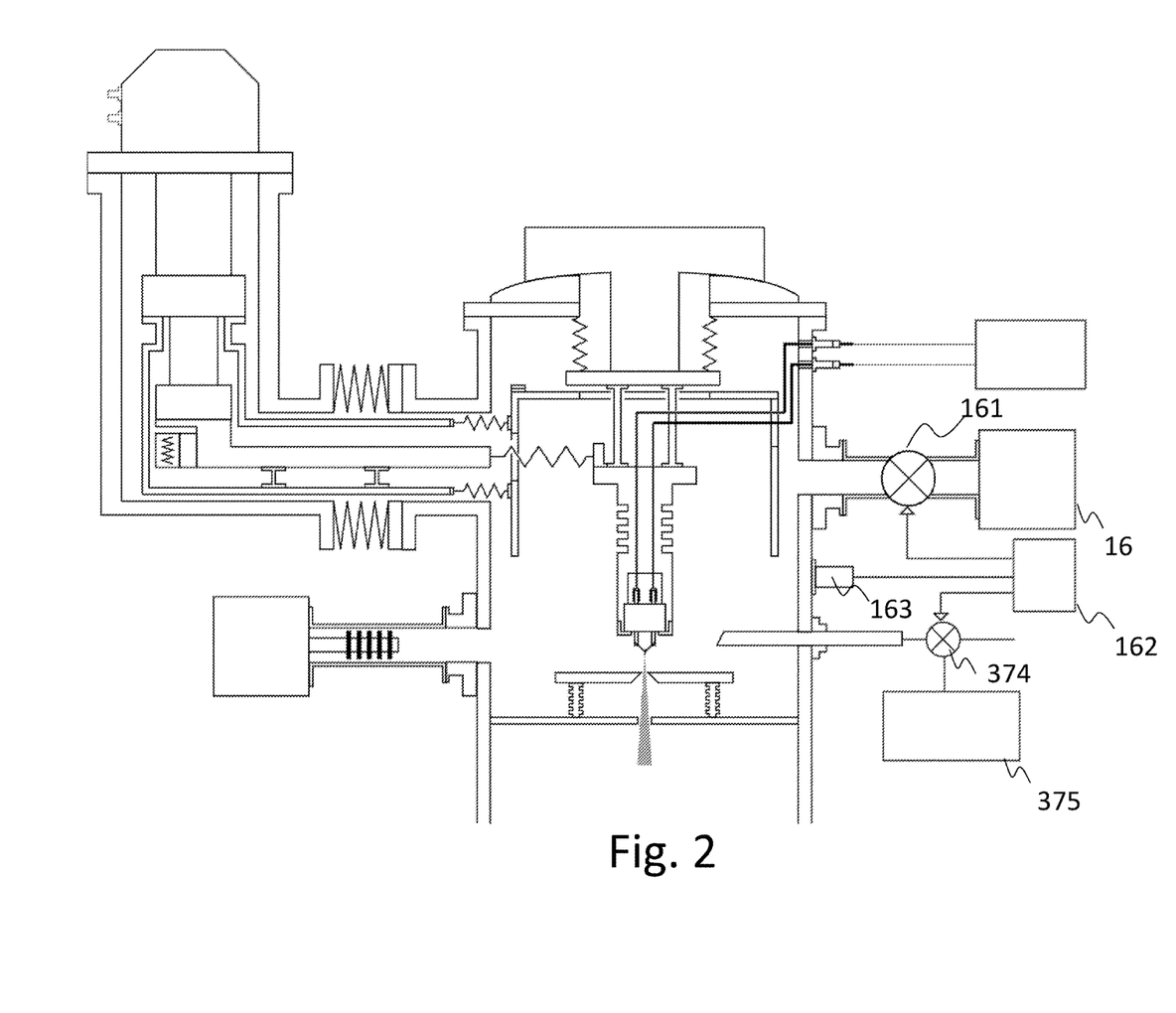
FIG. 2 is a schematic structural diagram of a gas flow rate control side of the gas field ionization source.

Then, flow rate adjustment in the gas field ionization source is described with reference to FIG. 2. According to an example described here, it is possible to make the hydrogen gas pressure inside the vacuum chamber 17 more stable with respect to the structure of FIG. 1. That is, a method for stabilizing the hydrogen gas pressure inside the vacuum chamber 17 is to adjust at least either the flow rate adjuster 161 or the flow rate adjuster 374 according to a measurement of the hydrogen gas pressure inside the vacuum chamber 17 taken by a pressure sensor 163. For instance, it may be arranged to indicate a target gas pressure on a pressure display 162 and adjust the flow rate adjuster 161 or the flow rate adjuster 374 to decrease difference between the target gas pressure and a measured gas pressure. A result of adjustment made by the flow rate adjuster 374 may be displayed on a flow rate display 375.

Figure 3:
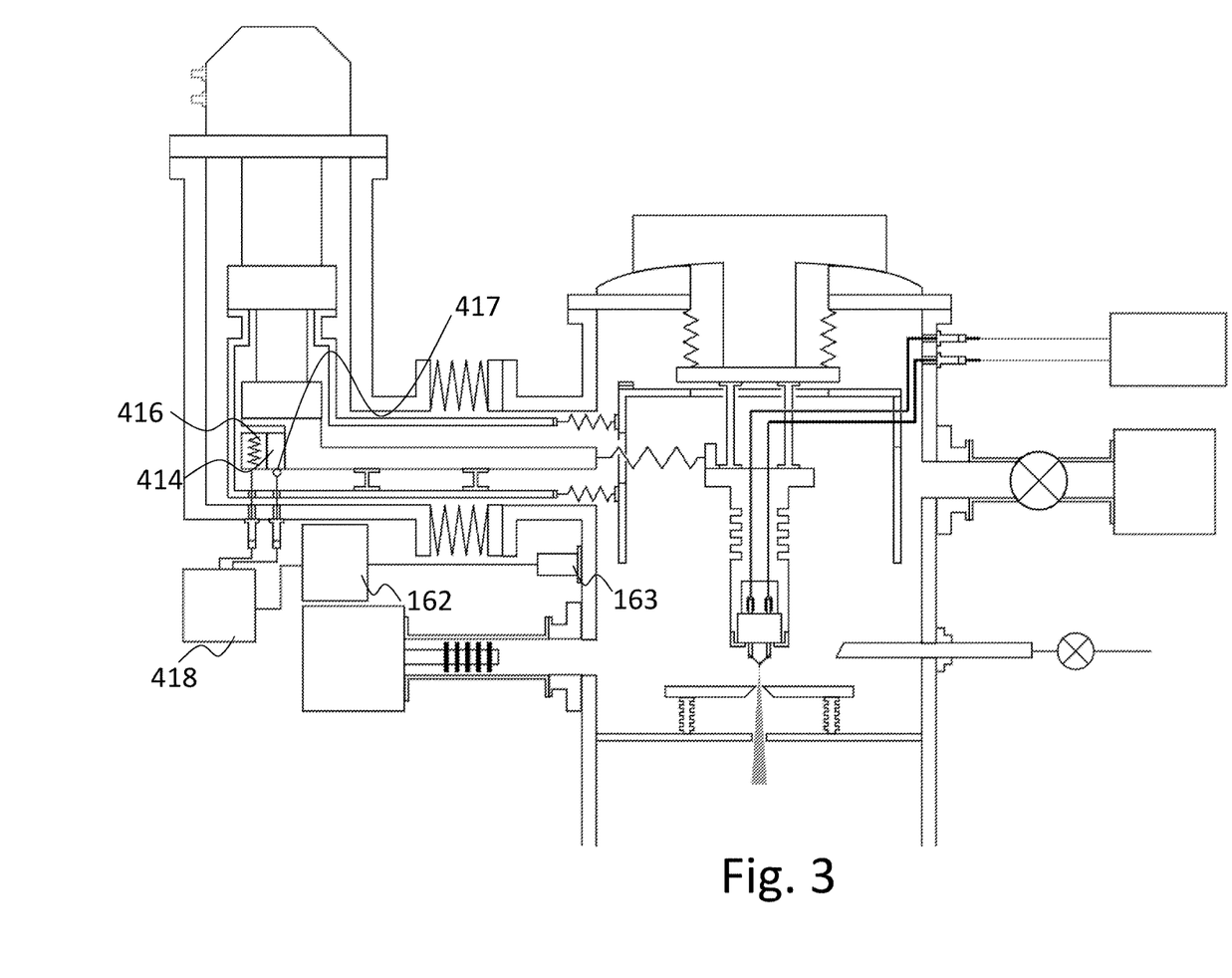
FIG. 3 is a schematic structural diagram of a cooling mechanism side of the gas field ionization source.

Then, the cryogenic pump is described with reference to FIG. 3. By adjusting the temperature of the cryogenic pump 414 by a temperature adjuster 418, it is possible to further reduce the effect in which the temperature change of the cryogenic pump 414 changes the hydrogen pressure inside the vacuum chamber 17. The temperature adjuster 418 may, for example, be configured to read the cryogenic pump temperature through a temperature sensor 417 connected to the cryogenic pump 414 and adjust the amount of current passing through a heater 416 to stabilize the cryogenic pump temperature to a target temperature. Alternatively, the temperature adjuster 418 may, for example, be configured to read the cryogenic pump temperature through the temperature sensor 417 connected to the cryogenic pump 414 and adjust the refrigerating capacity of the cooling mechanism 4 to stabilize the cryogenic pump temperature to a target temperature.

Furthermore, by pre-adjustment of output of the heater 416 according to a measurement of the pressure inside the vacuum chamber 17 taken by a pressure sensor 163, it is possible to counteract heat exchange of hydrogen gas exerted between the outer wall of the vacuum chamber 17 and the cryogenic pump 414 cooled by the cooling mechanism 4 when hydrogen gas is inserted into the vacuum chamber 17 and prevent the temperature of the cryogenic pump 414 from rising. Temperature rise of the cryogenic pump 414 increases the amount of an impurity gas inside the vacuum chamber 17 and, therefore, could result in destabilizing the amount of current of the ion beam 15.

The structure described hereinbefore can be expected to provide the same effect even using a nitrogen gas instead of the hydrogen gas. In addition, the cryogenic pump temperature may be set to a temperature different from that for the instance where the hydrogen gas is used.

The structure described hereinbefore concerns a solution provided by the present invention intended to stabilize the ion beam by performing cryogenic pump temperature management. A solution to the same problem can also be provided even if a non-evaporable getter pump is used instead of the cryogenic pump. This is described below.

In this case, the non-evaporable getter pump may be installed anywhere inside the ion beam apparatus, as is the case for the cryogenic pump 414 depicted in FIG. 1. It is more preferable to install the non-evaporable getter pump in the vicinity of the emitter tip 11 or in the same location as that of the cryogenic pump 414.

The non-evaporable getter pump also has a hydrogen gas exhaust capacity, as is the case for the cryogenic pump. The getter material of the non-evaporable getter pump has a characteristic of exhausting the hydrogen gas by causing diffusion and occlusion of the gas inside the getter material, not exhausting it by adsorbing the hydrogen gas. This characteristic means that a principle of exhausting the hydrogen gas differs from that of exhausting other impurity gas and largely differs from the principle in which other impurity gas is made to adsorb to the surface chemically and thus exhausted. That is, the speed at which the non-evaporable getter pump exhausts the hydrogen gas generally depends on the volume of the getter material, whereas the speed at which that pump exhausts other impurity gas generally depends on the surface area of the getter material.

The present inventors directed their attention to this characteristic and considered a non-evaporable getter pump shape that was useful for the present invention. That is, by decreasing the volume of the getter material of the non-evaporable getter pump with respect to its surface area, the hydrogen gas exhaust speed decreases relatively. As a concrete shape, it will be expedient to form the getter material of the non-evaporable getter pump as a thin film over a supporting material.

More specifically, by making the thin film of the getter material 10 um thick or less, it is possible to decrease the hydrogen gas exhaust speed, while maintaining the exhaust capacity for impurity gas to some extent. That is, it is enabled to further stabilize the pressure of the hydrogen gas inside the vacuum chamber 17 in the structure described for the first embodiment and, consequently, the ion beam 15 becomes stable.

Lastly, descriptions are provided about a case where an impurity gas still adsorbed to the extremity of the emitter tip 11, even if the amount of an impurity gas was reduced by stabilizing the hydrogen gas pressure in the way as described in the foregoing.

In this case, by increasing a pull-out voltage that is applied between the emitter tip 11 and the pull-out electrode 13 and enhancing the electric field at the extremity of the emitter tip, it is possible to remove the impurity gas adsorbed to the extremity of the emitter tip 11 by so-called electric field evaporation. Here, if the pull-out voltage is too high, metal atoms at the extremity of the emitter tip are also evaporated, together with the adsorbed impurity gas, by the electric field; conversely, if this voltage is too low, the adsorbed impurity gas is not evaporated by the electric field and no effect can be obtained.

It was found that, as a value of the pull-out voltage, it was preferable from the foregoing perspective to apply a voltage that doubled a pull-out voltage resulting in maximizing the amount of current of ion beam 15 emitted from the emitter tip 11.

After increasing the applied voltage for the pull-out voltage, upon making a decision that the extremity has placed in a sufficiently satisfactory condition, the pull-out voltage should be returned to its original value and the emission of the ion beam 15 will be restarted. For the above decision, a method called Field Ion Microscope (FIM) can be used; in this method, the condition of the extremity of the emitter tip can be observed at an atomic level resolution.

To obtain a FIM image, the following is used: a position sensitive detector called a Micro channel plate or a method that scans the ion beam 15 over a microscopic hole and makes two-dimensional one-to-one mapping between the amount of current of the ion beam passed through the microscope hole and a scan position of the ion beam 15.

An FIM image of the extremity of the emitter tip 11 placed in a satisfactory condition should be stored and, by comparing it with an FIM image after the foregoing electric field evaporation, it can be decided whether or not the foregoing electric field evaporation method is successful. This decision may be performed by a user or may be made by a program that assesses the correlation between both images of the tip extremity placed in a satisfactory condition and in an observed condition. It is not requisite to compare two temporally succeeding images only to make the decision. For instance, a series of FIM images of the tip extremity with different pull-out voltages applied is obtained in advance and a series of FIM images thereof in a condition after electric field evaporation with different pull-out voltages applied is also obtained and, by further comparing both series of FIM images, it is possible to make a decision with a higher accuracy.

LIST OF REFERENCE SIGNS

1 . . . Gas field ionization source,
11 . . . Emitter tip,
12 . . . Opening through which ion beam passes,
13 . . . Pull-out electrode,
14 . . . Outer wall of ionization chamber,
15 . . . Ion beam,
16 . . . Discharge type vacuum exhaust unit,
17 . . . Vacuum chamber,
18 . . . Trap type vacuum exhaust unit,
111 . . . Power supply,
161 . . . Flow rate adjuster,
162 . . . Pressure display,
163 . . . Pressure sensor,
164 . . . Pressure display,
37 . . . Gas introduction mechanism,
371 . . . Gas nozzle,
374 . . . Flow rate adjuster,
375 . . . Flow rate display,
376 . . . Hydrogen gas container
4 . . . Cooling mechanism,
41 . . . Refrigerator main unit,
412 . . . Refrigerator 1st stage,
413 . . . Refrigerator 2nd stage,
414 . . . Cryogenic pump,
415 . . . Heat radiation shield,
416 . . . Heater,
417 . . . Temperature sensor,
418 . . . Temperature adjuster

The invention claimed is:

1. An ion beam apparatus equipped with a field ionization source that supplies gas to a chamber, ionizes the gas, and applies an ion beam to a sample, the ion beam apparatus comprising:
an emitter electrode having a needle-like extremity;
a chamber inside which the emitter electrode is installed;
a gas supply unit that supplies the gas to the chamber;
a cooling unit that is connected to the chamber and cools the emitter electrode;
a discharge type exhaust unit that exhausts gas inside the chamber; and
a trap type exhaust unit that exhausts gas inside the chamber,
wherein exhaust conductance of the discharge type exhaust unit is larger than exhaust conductance of the trap type exhaust unit.

2. The ion beam apparatus according to claim 1, further comprising:
a heater connected to the trap type exhaust unit; and
a temperature control unit that controls temperature of the heater,
wherein the trap type exhaust unit is a cryogenic member that is connected to the chamber from the cooling unit via a heat transfer section, and the cryogenic member adsorbs at least a first gas species from which the ion beam is generated and a second gas species other than the first gas species.

3. The ion beam apparatus according to claim 2, further comprising:
a pressure sensor that measures a pressure inside the chamber,
wherein the temperature control unit controls the temperature of the heater based on output of the pressure sensor.

4. The ion beam apparatus according to claim 3,
wherein, when the temperature of the emitter tip falls in a range from 20 K to 60 K, the temperature control unit controls the temperature of the cryogenic member to fall in a range from 10 K to 30 K.

5. The ion beam apparatus according to claim 1,
wherein the chamber and the gas supply unit are connected via a first flow rate adjuster, and
wherein the chamber and the discharge type exhaust unit are connected via a second flow rate adjuster.

6. The ion beam apparatus according to claim 5, further comprising:
a pressure sensor that measures a pressure inside the chamber,
wherein the first flow rate adjuster and the second flow rate adjuster control the flow rate of the gas based on output of the pressure sensor.

7. The ion beam apparatus according to claim 1,
wherein the trap type exhaust unit is a non-evaporable getter pump in which a getter member with a film thickness of 10 um or less is formed over the surface of a supporting member.

8. The ion beam apparatus according to claim 1, wherein the gas to be supplied is hydrogen or nitrogen.

9. The ion beam apparatus according to claim 1, further comprising:
a detector that detects a condition of the emitter tip; and
a pull-out electrode for applying an ion beam generated from the gas to a sample,
wherein a voltage that is applied to the pull-out electrode is controlled based on information detected by the detector.

10. The ion beam apparatus according to claim 9,
wherein information detected by the detector includes an image obtained by scanning an ion beam passing through an aperture or an image obtained using a micro channel plate.

11. An ion beam irradiation method having an irradiation step of applying an ion beam generated by ionizing introduced gas to a sample, the ion beam irradiation method comprising:
a cooling step of cooling an emitter electrode having a needle-like extremity by a cooling unit;
a supply step of supplying the gas to a space near the emitter electrode;
a discharge type exhaust step of exhausting gas inside the chamber using a discharge type exhaust unit;
a trap type exhaust step of exhausting gas inside the chamber using a trap type exhaust unit that differs from the discharge type exhaust unit;
a measurement step of measuring pressure near the emitter electrode using a pressure sensor; and
a gas flow rate control step of controlling the amount of the gas to be supplied at the supply step and the amount of the gas to be exhausted at the discharge type exhaust step, based on a result of measurement made by the measurement step, wherein the gas flow rate control step is performed to keep exhaust conductance of the discharge type exhaust unit larger than exhaust conductance of the trap type exhaust unit.

12. The ion beam irradiation method according to claim 11, comprising:
a cryogenic step of cooling a member connected to the chamber from the cooling unit via a heat transfer section down to a temperature at which a cryogenic effect takes place; and
an adsorption step of controlling a temperature of the cooled member and adsorbing at least a first gas species from which the ion beam is generated and a second gas species other than the first gas species.

13. The ion beam irradiation method according to claim 12, further comprising:
a pressure measurement step of measuring a pressure inside the chamber inside which the emitter electrode is installed,
wherein the adsorption step controls the temperature of the member based on the measured pressure.

14. An ion beam apparatus equipped with a field ionization source that supplies gas to a chamber, ionizes the gas, and applies an ion beam to a sample, the ion beam apparatus comprising:
an emitter electrode having a needle-like extremity;
a chamber inside which the emitter electrode is installed;
a gas supply unit that supplies the gas to the chamber;
a cooling unit that is connected to the chamber and cools the emitter electrode;
a discharge type exhaust unit that exhausts gas inside the chamber;
a cryogenic member that is connected to the chamber from the cooling unit via a heat transfer section, and the cryogenic member adsorbs at least a first gas species from which the ion beam is generated and a second gas species other than the first gas species;
a heater connected to the cryogenic member; and
a temperature control unit that controls temperature of the heater,
wherein exhaust conductance of the discharge type exhaust unit is larger than exhaust adsorbance of the trap type exhaust unit.

15. The ion beam apparatus according to claim 14, further comprising:
a pressure sensor that measures a pressure inside the chamber,
wherein the temperature control unit controls the temperature of the heater based on output of the pressure sensor.

* * * * *